US010028346B1

(12) United States Patent
Nakano (10) Patent No.: US 10,028,346 B1
(45) Date of Patent: Jul. 17, 2018

(54) POWER SOURCE DEVICE AND LIGHT RADIATION SYSTEM EQUIPPED WITH SAME

(71) Applicant: CCS Inc., Kyoto-shi, Kyoto (JP)

(72) Inventor: Sho Nakano, Kyoto (JP)

(*) Notice: Subject to any disclaimer, the term of this patent is extended or adjusted under 35 U.S.C. 154(b) by 0 days.

(21) Appl. No.: 15/741,032

(22) PCT Filed: Jun. 13, 2016

(86) PCT No.: PCT/JP2016/067517
§ 371 (c)(1),
(2) Date: Dec. 29, 2017

(87) PCT Pub. No.: WO2017/006709
PCT Pub. Date: Jan. 12, 2017

(30) Foreign Application Priority Data

Jul. 8, 2015 (JP) .................................. 2015-136605

(51) Int. Cl.
H05B 33/08 (2006.01)
(52) U.S. Cl.
CPC ....... *H05B 33/0842* (2013.01); *H05B 33/089* (2013.01)
(58) Field of Classification Search
None
See application file for complete search history.

(56) References Cited

U.S. PATENT DOCUMENTS

2004/0090189 A1* 5/2004 Yoneda ............. H05B 33/0848
315/291
2015/0373811 A1* 12/2015 Dunser ............. H05B 33/0815
315/185 R 2016/0021712 A1* 1/2016 Nakamura ......... H05B 33/0809
315/82

FOREIGN PATENT DOCUMENTS

JP  H07297793 A   11/1995
JP  2001024226 A   1/2001
JP  2004158840 A   6/2004
(Continued)

OTHER PUBLICATIONS

ISA Japan Patent Office, International Search Report Issued in PCT Application No. PCT/JP2016/067517, dated Aug. 30, 2016, WIPO, 4 pages. (Submitted with English Translation of International Search Report).

*Primary Examiner* — Jany Richardson
(74) *Attorney, Agent, or Firm* — Alleman Hall Creasman & Tuttle LLP (57) ABSTRACT

The present invention intends to increase the type of a light source that can be determined by widening a range of an identification resistance value. The power source device is connected to a light radiation device which is equipped with: a light source having one or more LEDs; and an identification resistance whereof the resistance value differs for each type of the light source. The power source device comprises: an identification resistance determination circuit having a voltage dividing resistance connected in series to the identification resistance; and a control unit for measuring the divided voltage applied to the voltage dividing resistance, determining the type of the light source based on the divided voltage value, and controlling the power to the light source according to the type thereof. The identification resistance determination circuit has a plurality of switchable voltage dividing resistances are provided, each having a different resistance value.

5 Claims, 5 Drawing Sheets (56) References Cited

FOREIGN PATENT DOCUMENTS

| JP | 2006351484 A | 12/2006 |
|----|--------------|---------|
| JP | 2011138716 A | 7/2011  |
| JP | 2013004280 A | 1/2013  |
| JP | 2013136298 A | 7/2013  |
| JP | 2014030358 A | 2/2014  |

* cited by examiner

FIRST DETERMINATION DATA

| DIVIDED VOLTAGE VALUE [V] | IDENTIFICATION RESISTANCE [Ω] |
|---|---|
| 0.98~1.18 | 12k |
| 1.26~1.50 | 8.2k |
| 1.69~1.86 | 5.6k |
| 2.16~2.37 | 3.9k |
| 2.70~2.94 | 2.7k |

FIG. 3A

SECOND DETERMINATION DATA

| DIVIDED VOLTAGE VALUE [V] | IDENTIFICATION RESISTANCE [Ω] |
|---|---|
| 0.90~1.10 | 60k |
| 1.37~1.57 | 36k |
| 1.92~2.12 | 22k |

POWER SOURCE DEVICE AND LIGHT RADIATION SYSTEM EQUIPPED WITH SAME

FIELD OF THE ART

This invention relates to a power source device to be connected to a light radiation device and a light radiation system using the power source device.

BACKGROUND ART

As shown in the patent document 1, this kind of the power source device is configured to be connected to the light radiation device comprising a light source and an identification resistance whose resistance value differs for each type of the light source, and the type of the light source is automatically determined and the light source can be controlled to change the brightness of the electric light in accordance with the determined type of the light source.

If explained more concretely, the power source device has a voltage dividing resistance connected in series to the identification resistance, the divided voltage applied to the voltage dividing resistance is measured, and the type of the light source is determined based on the measured divided voltage value.

However, in the case that the type of the light source is determined based on the divided voltage value, it is necessary to select the identification resistance among a limited range of the resistance value in order for the divided voltage value to fall within the measurement range.

In addition, since the resistance value of the identification resistance contains a manufacturing error, if the resistance value of the identification resistance of each light source is close to each other, it is not possible to distinguish whether the difference in the measured divided voltage value appears due to the type of the light source or due to the manufacturing error of the identification resistance.

For this reason, the type of the resistance value that can be used as the identification resistance is limited so that the present structure can determine only limited types of the light source, and the number of these types is not satisfactory at all.

PRIOR ART DOCUMENT

Patent Document

Patent document 1: Japanese Unexamined Patent Application Publication No. 2006-351484

DISCLOSURE OF THE INVENTION

Problems to be Solved by the Invention

The present claimed invention intends to solve all of the above-mentioned problems, and a main object of this invention is to increase a number of a type of a light source that can be determined by widening a range of a resistance value of a resistance that can be used as an identification resistance.

Means to Solve the Problems

More specifically, the power source device in accordance with this present claimed invention is a power source device that is connected to a light radiation device comprising a light source having one or a plurality of LEDs and an identification resistance whose resistance value is different for each type of the light source, and that comprises an identification resistance determination circuit that has a voltage dividing resistance to be connected to the identification resistance in series, and a control unit that measures a divided voltage applied to the voltage dividing resistance, determines the type of the light source based on the divided voltage value, and controls a power to the light source according to the type thereof, and the identification resistance determination circuit comprises a plurality of the voltage dividing resistances, each of which has a different resistance value, and is configured such that the voltage dividing resistance that is connected to the identification resistance can be switched.

In accordance with the power source device having this arrangement, since a plurality of the voltage dividing resistances whose resistance values differ from each other are switchably provided for the identification resistance determination circuit, the range of the resistance value of the identification resistance wherein the divided voltage value can fall within the measurement range is changed by switching the voltage dividing resistance. With this arrangement, it is possible to increase the number of the type of the light source that can be determined by widening the range of the resistance value of the identification resistance that can be used.

In order to make it possible to automatically determine more numerous types of the light source than that of a conventional arrangement, it is preferable that the identification resistance determination circuit comprises a first voltage dividing resistance and a second voltage dividing resistance whose resistance value is different from that of the first voltage dividing resistance, and in a case that it is not possible to determine the type of the light source based on the divided voltage applied to the first voltage dividing resistance, the control unit switches the voltage dividing resistance to be connected to the identification resistance from the first voltage dividing resistance to the second voltage dividing resistance.

In addition, in a case that it is not possible to determine the type of the light source based on the divided voltage applied to the second voltage dividing resistance, it is preferable that the control unit outputs a signal indicating that the determination is not possible.

In accordance with this arrangement, it is possible to notify a user that there is a defect in the light radiation device or the power source device due to deterioration of, for example, the identification resistance or the voltage dividing resistance, or that a light radiation device that does not correspond to the power source device is connected.

In addition, represented as a concrete embodiment is an arrangement wherein the control unit has a determination data memory part that stores determination data wherein the divided voltage value of the voltage dividing resistance is associated with information relating to the type of the light source, and the determination data memory part stores a plurality of items of the determination data, each of which corresponds to each of the voltage dividing resistances respectively in a state of being combined with each of the voltage dividing resistances.

Furthermore, a light radiation system in accordance with this invention comprises a light radiation device provided with a light source having one or a plurality of LEDs and an identification resistance whose resistance value is different for each type of the light source, and the power source device described above is connected to the light radiation device. Also in accordance with this arrangement of the light radiation system, it is possible to obtain the same effect and operation as that of the above-mentioned power source device.

Effect of the Invention

In accordance with the present claimed invention having the above-mentioned arrangement, since it is possible to widen a range of the resister value that can be utilized as the identification resistance, the number of the type of the light source that can be determined can be increased.

LIST OF REFERENCE CHARACTERS

100 . . . light radiation system
10 . . . LED light radiation device
11 . . . LED
12 . . . light source
13 . . . identification resistance
20 . . . power source device
23 . . . identification resistance determination circuit
231 . . . voltage dividing resistance
24 . . . control unit

BEST MODES OF EMBODYING THE INVENTION

One embodiment of a light radiation system in accordance with this invention will be described with reference to the drawings.

Figure 1:
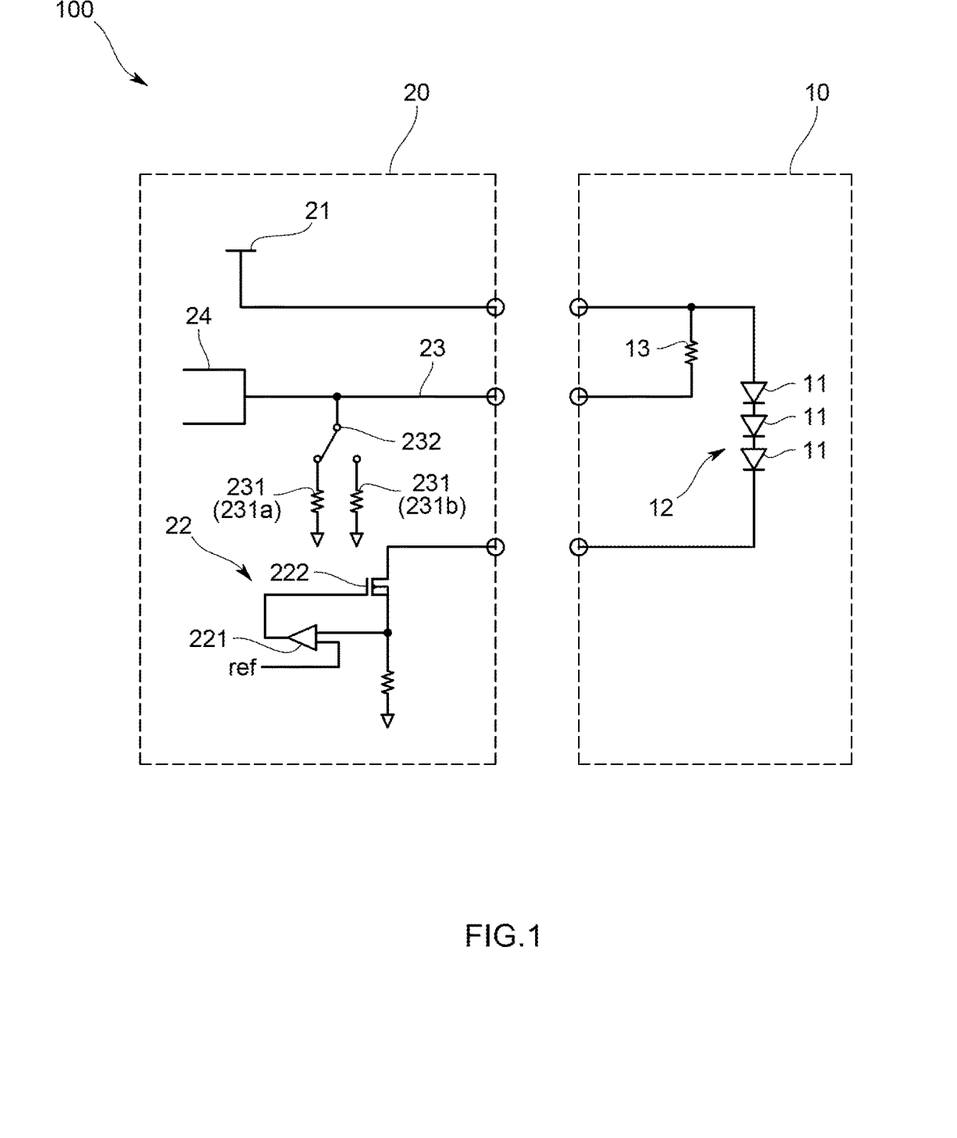
FIG. 1 is a circuit diagram of a light radiation system in accordance with this embodiment.

The light radiation system 100 in accordance with this embodiment comprises, as shown in FIG. 1, an LED light radiation device 10 as a light radiation device, and a power source device 20 to which the LED light radiation device 10 is connected, and is of, for example, a constant current type. In this embodiment, the LED light radiation device 10 is connected to the power source device 20; however, a light radiation device that is loaded with LEDs that irradiate ultraviolet rays and that is used for UV curing may be connected to the power source device 20.

First, the LED light radiation device 10 will be described.

The LED light radiation device 10 is connected to the power source device 20 through a connector, not shown in the drawings, and comprises a light source 12 having one or a plurality of LEDs 11 and an identification resistance 13 whose resistance value is different for each type of the light source 12.

Since there are various types of the light source 12 (the LED light radiation device 10) with specifications such as a rated current or a rated voltage, or a number or a characteristic of the LEDs 11 is different, a different resistance value is set for the identification resistance 13 according to the type of the light source 12 in order to identify the type of the light source 12 (the LED light radiation device 10), and the light source 12 comprises a resistor arranged in parallel to the LEDs 11 in this embodiment.

Eight types of the light sources 12 (the LED light radiation device 10) whose rated currents are different from each other are prepared in this embodiment (one of the light sources 12 is shown in FIG. 1), and 2.7 kΩ, 3.9 kΩ, 5.6 kΩ, 8.2 kΩ, 12 kΩ, 22 kΩ, 36 kΩ, and 60 kΩ are used for these identification resistances 13.

Next, the power source device 20 will be described.

The power source device 20 is to supply an electric power to the LED light radiation device 10 to which the power source device 20 is connected, and comprises, as shown in FIG. 1, a variable power source 21 to be connected to the light source 12, a constant current control circuit 22 that controls the electric current supplied to the light source 12 so as to be constant, an identification resistance determination circuit 23 to determine a resistance value of the identification resistance 13, and a control unit 24 that is connected to the identification resistance determination circuit 23.

The variable power source 21 is configured to apply a predetermined DC voltage to the light source 12, and the applied voltage is set so as to flow a rated current in the light source 12 based on a voltage command value from the control unit 24, to be described later.

The constant current control circuit 22 performs analog control on the current flowing in the light source 12 by feedback control, and as shown concretely in FIG. 1, is configured by making use of an operational amplifier 221 and an FET (field-effect transistor) 222. The rated current of the light source 12 is input to the operational amplifier 221 as a target current by the control unit 24, to be described later.

The identification resistance determination circuit 23 has a voltage dividing resistance 231 connected in series to the identification resistance 13, and is configured to divide the applied voltage of the variable power source 21 into the identification resistance 13 and the voltage dividing resistance 231.

In the case that the applied voltage of the variable power source 21 is set to be "E", the resistance value of the identification resistance 13 to be "R" and the resistance value of the voltage dividing resistance 231 to be "r", a divided voltage "V" applied to the voltage dividing resistance 231 is expressed by the following expression (1).

$$V = E * r / (R + r) \qquad \text{expression (1)}$$

The identification resistance determination circuit 23 of this embodiment comprises, as shown in FIG. 1, a plurality of voltage dividing resistances 231 whose resistance values differ from each other, and the voltage dividing resistance 231 to be connected to the identification resistance 13 can be switched to the other voltage dividing resistance 231. More concretely, the identification resistance determination circuit 23 is provided with a first voltage dividing resistance 231a and a second voltage dividing resistance 231b having a resistance larger than that of the first voltage dividing resistance 231a in parallel, and the first voltage dividing resistance 231a or the second voltage dividing resistance 231b can be alternatively connected to the identification resistance 13 by the use of a switch 232 such as, for example, a semiconductor switching element. In this embodiment, the resistance value of the first voltage dividing resistance 231a is 3.3 kΩ, and the resistance value of the second voltage dividing resistance 231b is 15 kΩ.

Figure 2:
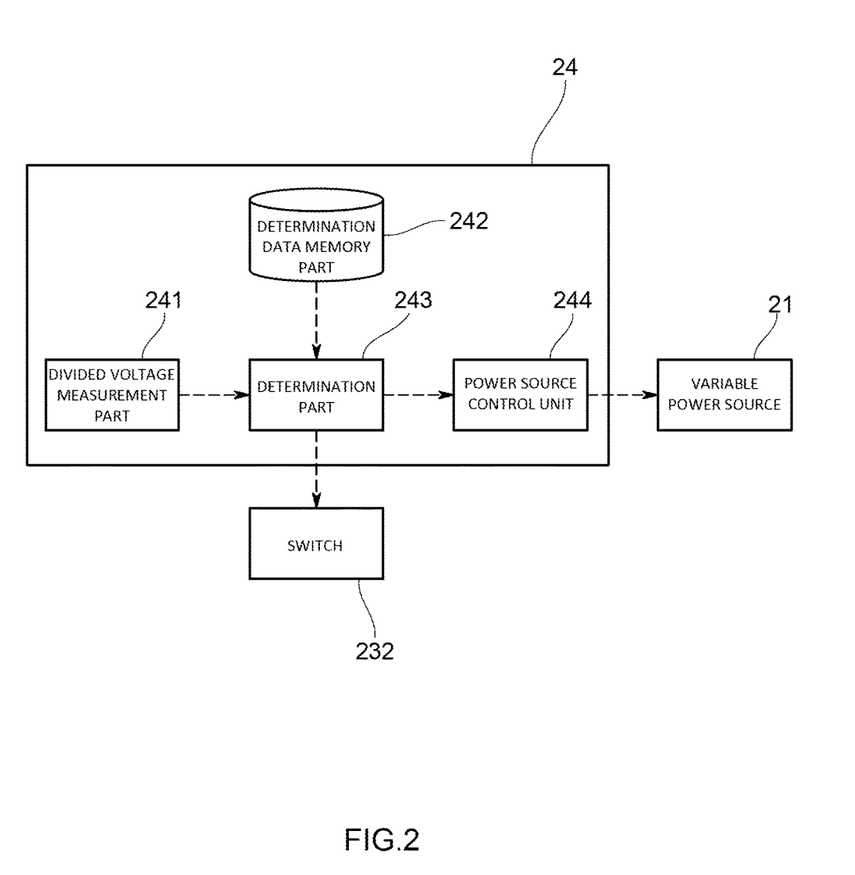
FIG. 2 is a function block diagram of a control part in this embodiment.

Physically, the control unit 24 comprises a CPU, a memory, and an input device or the like, and as shown in FIG. 2, produces functions as a divided voltage measurement part 241, a determination data memory part 242, a determination part 243, and a power source control unit 244 by operating according to predetermined programs stored in the memory.

Each part will be described.

The divided voltage measurement part 241 measures a divided voltage applied to the voltage dividing resistance 231 within a predetermined measurement range and outputs the divided voltage value to the determination part 243, and is configured by making use of an A/D board having, for example, a predetermined resolution.

The determination data memory part 242 is formed in a predetermined area of the memory, and stores determination data wherein information relating to the type of the light source 12 is associated with the divided voltage value measured by the divided voltage measurement part 241.

More concretely explained, as is clear from the above-mentioned expression (1), if the applied voltage (E) of the variable power source 21, the resistance value (R) of the identification resistance 13, and the resistance value (r) of the voltage dividing resistance 231 are determined, the divided voltage value (V) applied to the voltage dividing resistance 231 is uniquely determined. However, practically, since the resistance value (R), (r) of each resistance 13, 231 contains a manufacturing error, even though another different LED radiation device 10 having the light source 12 of the same type is connected to the power source device 20, there might be a difference in the above-mentioned divided voltage value (V).

Figure 3A:
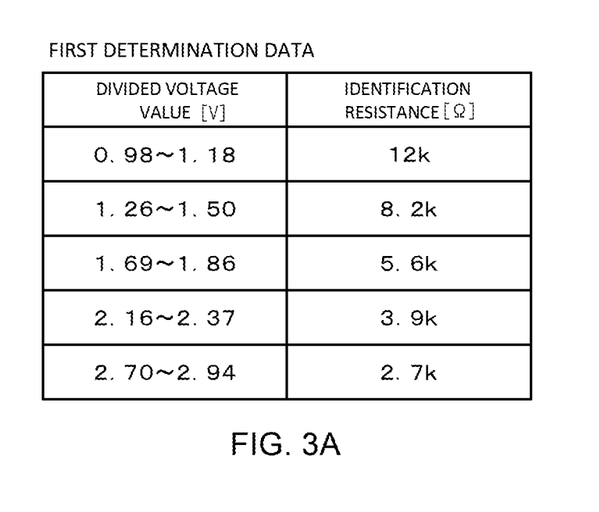
FIGS. 3A and 3B are tables is a view showing determination data in this embodiment.
Figure 3B:
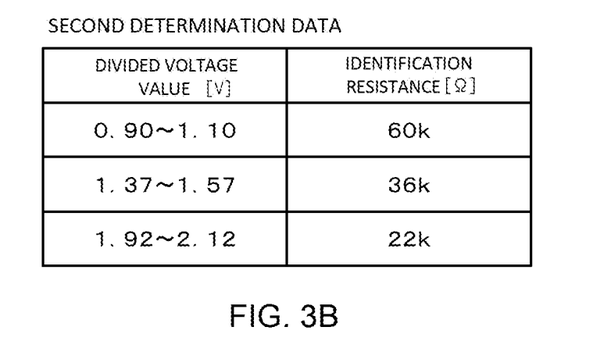

Then, in this embodiment, the divided voltage value corresponding to the type of each light source 12 is stored with a margin of error in consideration of the above-mentioned manufacturing error. In other words, as shown in FIGS. 3A and 3B, the determination data memory part 242 of this embodiment stores the data as, for example, a lookup table by combining the resistance value of each identification resistance 13 with a predetermined range of the divided voltage value corresponding to each resistance value (hereinafter also referred to as a divided voltage value width).

Adjacent divided voltage value widths are set not to overlap each other based on the divided voltage value (V) (a theoretical value) calculated by the above-mentioned expression (1).

In this embodiment, a plurality of voltage dividing resistances 231 are provided, and the determination data memory part 242 stores each of the determination data that is different for each of the voltage dividing resistances 231. The determination data memory part 242 stores the first determination data corresponding to the first voltage dividing resistance 231a and the second determination data corresponding to the second voltage dividing resistance 231b to be combined with each voltage dividing resistance 231.

The determination part 243 obtains the divided voltage value from the divided voltage measurement part 241, refers to the determination data stored in the determination data memory part 242, and determines the type of the light source 12 that corresponds to the obtained divided voltage value.

More concretely, the determination part 243 detects which of the first voltage dividing resistance 231a and the second voltage dividing resistance 231b is connected to the identification resistance 13, refers to the determination data that corresponds to the connected voltage dividing resistance 231 and determines the divided voltage value width in which the divided voltage value is contained. Then the determination part 243 determines the type of the light source 12 based on the resistance value of the identification resistance 13 corresponding to the divided voltage value width and outputs an identification signal, according to the type of the light source 12, to the power source control unit 244.

The power source control unit 244 obtains the identification signal from the above-mentioned determination part 243, and controls the variable power source 21 by outputting a control signal to the variable power source 21 in accordance with the type of the light source 12. More concretely, the power source control unit 244 controls an electric current or a voltage of the variable power source 21 appropriately for each type of the light source 12 based on the information contained in the identification signal such as, for example, a rated current, a rated voltage, an upper limit electric current and an upper limit voltage, or the information contained in the identification signal such as a number or a characteristic of the LED 11.

The power source control unit 244 in this embodiment is configured to control an applied voltage of the variable power source 21 so as to flow the rated electric current in the light source 12, and to input the rated electric current to an operational amplifier 221 of the constant current control circuit 22 as a target electric current.

Figure 4:
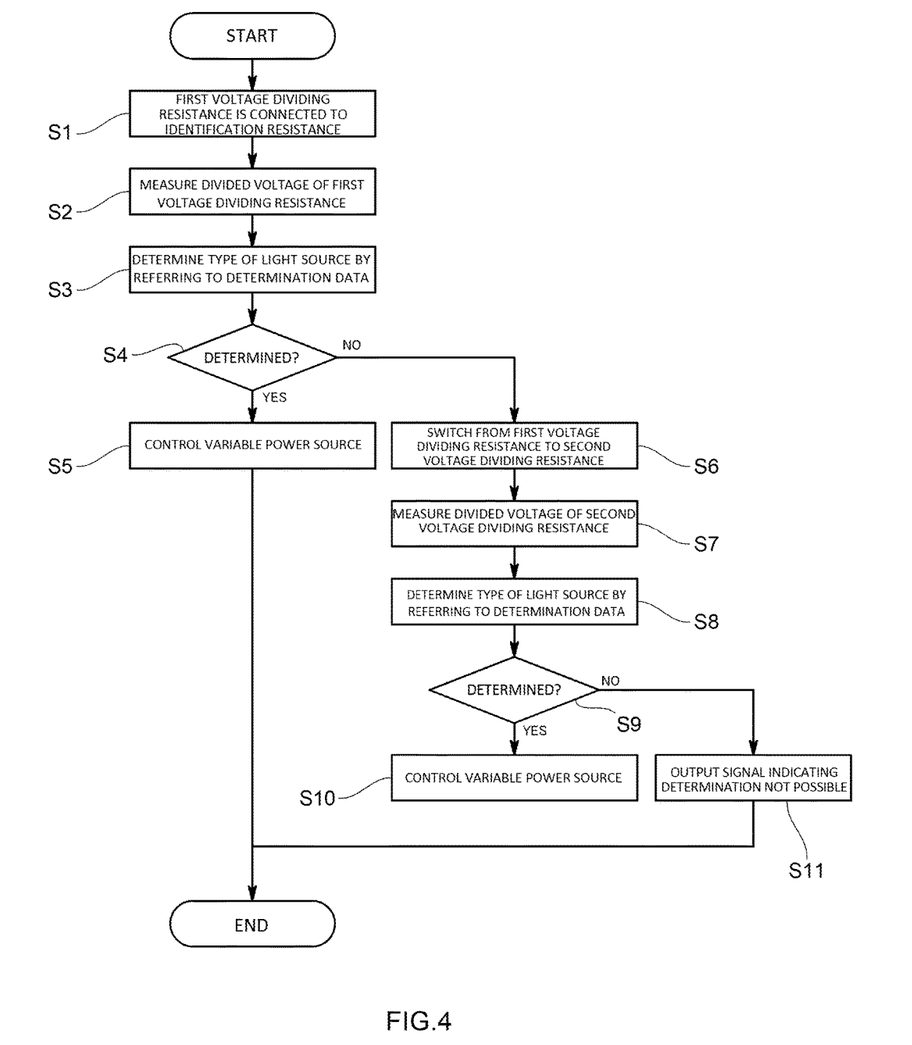
FIG. 4 is an operation flow chart of the light radiation system in this embodiment.

Next, an operation of the above-mentioned control unit 24 will be described with reference to FIG. 2 and FIG. 4.

When the LED light radiation device 10 is connected to the power source 20, first the determination part 243 outputs a switch signal to the switch 232 and connects the first voltage dividing resistance 231a to the identification resistance 13 (S1).

Then, the power source control unit 244 outputs a control signal to the variable power source 21 and applies the predetermined voltage (for example, 5V) to the identification resistance 13, and the divided voltage measurement part 241 measures the divided voltage value of the first voltage dividing resistance 231a (S2).

Next, the determination part 243 obtains the divided voltage value of the first voltage dividing resistance 231a from the divided voltage measurement part 241, refers to the first determination data stored in the determination data memory part 242, detects the divided voltage value width in which the divided voltage value is contained, and determines the type of the light source 12 (S3).

In the case that the divided voltage value width in which the divided voltage value is contained is detected (S4), the determination part 243 outputs the identification signal according to the type of the determined light source 12 to the power source control unit 244, and the power source control unit 244 controls the variable power source 21 based on the identification signal (S5).

Meanwhile, in the case that the determination part 243 is unable to determine the type of the light source 12 based on the divided voltage value of the first voltage dividing resistance 231a, namely, in the case that the divided voltage value measured by the divided voltage measurement part 241 is not contained in any divided voltage value width (S4), the determination part 243 outputs the switch signal to the switch 232 and switches the voltage dividing resistance 231 to be connected to the identification resistance 13 from the first voltage dividing resistance 231a to the second voltage dividing resistance 231b (S6).

Similar to the case wherein the type of the light source 12 is determined by the use of the first voltage dividing resistance 231a, the divided voltage measurement part 241 measures the divided voltage value of the second voltage dividing resistance 231b (S7), and the determination part 243 refers to the second determination data stored in the determination data memory part 242 and determines the type of the light source 12 (S8).

In the case that the type of the light source 12 is determined (S9), the identification signal according to the type of the light source 12 is output to the power source control unit 244 and the power source control unit 244 controls the variable power source 21 based on the identification signal (S10).

In the case that the determination part 243 is unable to determine the type of the light source 12 based on the divided voltage value of the second voltage dividing resistance 231b (S9), the determination part 243 in this embodiment outputs a signal indicating that the determination is not possible and reports the user that the type of the light source 12 is unable to be determined (S11).

In accordance with the light radiation system 100 of this embodiment having the above-mentioned arrangement, since a plurality of voltage dividing resistances 231 whose resistance values differ from each other are switchably provided for the identification resistance determination circuit 23, the range of the resistance value of the identification resistance 13 wherein the divided voltage value can fall in the measurement range of the divided voltage measurement part 241 is changed by switching the voltage dividing resistance 231 by the determination part 243. With this arrangement, it is possible to increase the number of the type of the light source 12 that can be determined by making use of the identification resistance 13 having a resistance value that has not been possible to use.

As is clear from the above-mentioned expression (1), in the case that the resistance value (R) of the identification resistance 13 is big, the measured divided voltage value (V) becomes a value close to zero.

According to this, conventionally, when the difference in the measured divided voltage value at a time when a certain identification resistance 13 is changed to another identification resistance 13 becomes smaller than the resolution of the measurement part, it is not possible to distinguish the two different identification resistances 13, and thus it is difficult to use the identification resistance 13 having a large resistance value (R), also resulting in limiting the types of the light source 12 that can be determined.

Meanwhile, in accordance with the light radiation system 100 of this invention, since the resistance value (r) of the voltage dividing resistance 231 increases by switching from the first voltage dividing resistance 231a to the second voltage dividing resistance 231b, even though the identification resistance 13 whose resistance value (R) is big is used, it is possible to increase the divided voltage value (V) to be measured. With this arrangement, it is possible to widen the range of the resistance value (R) that can be used as the identification resistance 13 so that it is possible to increase the number of the types of the light source 12 that can be determined.

Furthermore, since the determination part 243 determines the type of the light source 12, and the voltage dividing resistance 231 to be connected to the identification resistance 13 is configured to be switchable to the other voltage dividing resistance 231, it is possible to automatically determine more numerous types of the light source 12, without reducing usability for the user.

In addition, since the determination part 243 outputs the signal indicting that the determination is not possible in the case that the type of the light source 12 is unable to be determined also by the divided voltage value (V) of the second voltage dividing resistance 231b, it is possible to notify the user that there is a defect in the LED light radiation device 10 or the power source device 20 due to deterioration of, for example, the identification resistance 13 or the voltage dividing resistance 231, or that an LED light radiation device 10 that does not correspond to the power source device 20 is connected.

The present claimed invention is not limited to the above-mentioned embodiments.

In the above-mentioned embodiments, for example, the identification resistance 13 and the voltage dividing resistance 231 are the resistance; however, they may be a condenser or an inductance having predetermined impedance.

Figure 5:
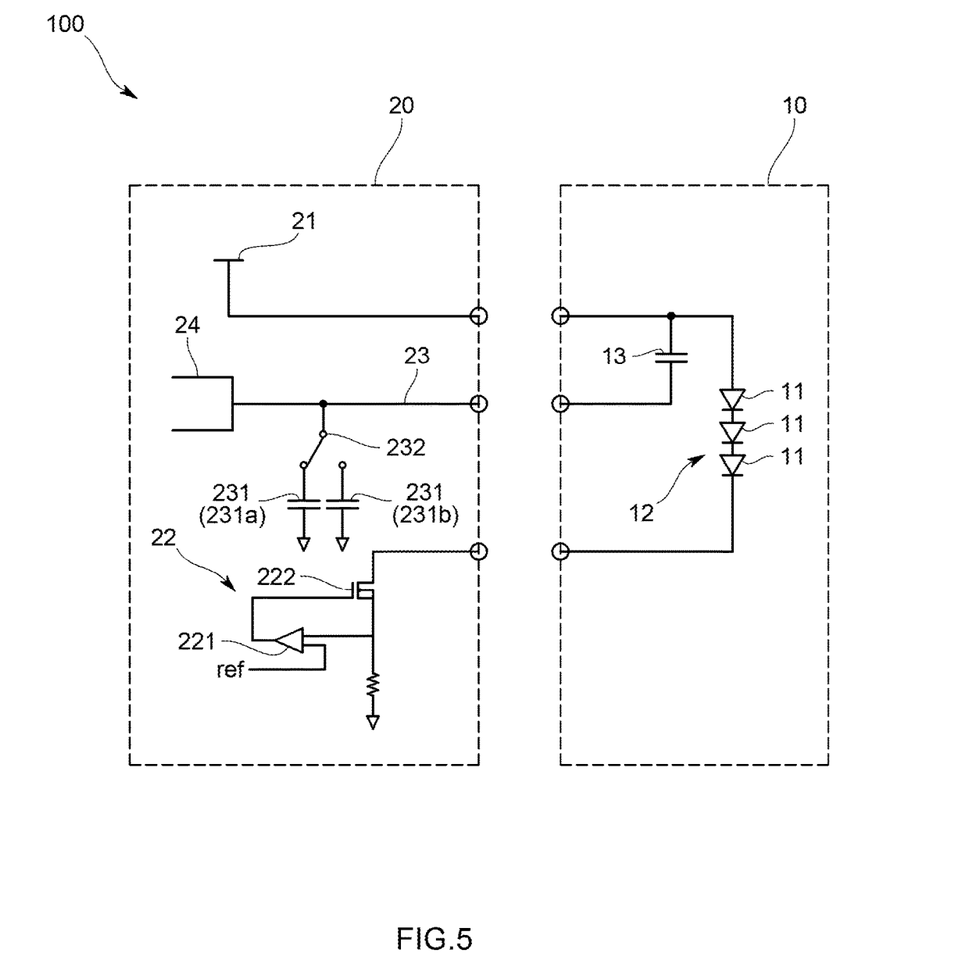
FIG. 5 is a circuit diagram of a light radiation system in accordance with another embodiment.

As a concrete embodiment, as shown in FIG. 5, it may be represented that a condenser having a different capacity for each type of the light source 12 is arranged instead of the identification resistance 13, and a condenser having a predetermined capacity is arranged instead of the voltage dividing resistance 231.

The identification resistance determination circuit 23 of the above-mentioned embodiment has two voltage dividing resistances 231; however, it also may have an arrangement having three or more voltage dividing resistances 231 arranged in parallel.

The light source 12 of the above-mentioned embodiment has a plurality of the LEDs 11 connected in series; however, it also may have a single LED 11, or may have a plurality of LEDs 11 connected in parallel.

In the above-mentioned embodiment, the determination part 243 outputs the switch signal to the switch 232 and switches the voltage dividing resistance 231; however, it may also be so arranged that an operator inputs the switch signal from the outside and switches the voltage dividing resistance 231.

The power source control unit 244 of the above-mentioned embodiment is configured so that the variable power source 21 is controlled so as to flow the rated current in the light source 12; however, the variable power source 21 may also be controlled so as to apply the rated voltage to the light source 12.

The light radiation system 100 of the above-mentioned embodiment is a constant current type; however, it also may be a constant voltage type.

In addition, the present claimed invention is not limited to the above-mentioned embodiments, and may be variously modified without departing from the spirit of the invention.

INDUSTRIAL APPLICABILITY

As mentioned above, in accordance with the present claimed invention, since the range of the resistance value that can be utilized as the identification resistance can be widened, it is possible to increase the number of the type of the light source that can be determined.

The invention claimed is:

1. A power source device that is connected to a light radiation device comprising a light source having one or a plurality of LEDs and an identification resistance whose resistance value is different for each type of the light source, comprising:
    an identification resistance determination circuit that has a voltage dividing resistance to be connected to the identification resistance in series; and
    a control unit that measures a divided voltage applied to the voltage dividing resistance, determines the type of the light source based on the divided voltage value, and controls a power to the light source according to the type thereof, wherein
    the identification resistance determination circuit comprises a plurality of the voltage dividing resistances each of which has a different resistance value, and is configured such that the voltage dividing resistance that is connected to the identification resistance can be switched.

2. The power source device described in claim 1, wherein
the identification resistance determination circuit comprises a first voltage dividing resistance and a second voltage dividing resistance whose resistance value is different from that of the first voltage dividing resistance, and in a case that it is not possible to determine the type of the light source based on the divided voltage applied to the first voltage dividing resistance, the control unit switches the voltage dividing resistance to be connected to the identification resistance from the first voltage dividing resistance to the second voltage dividing resistance.

3. The power source device described in claim 2, wherein in a case that it is not possible to determine the type of the light source based on the divided voltage applied to the second voltage dividing resistance, the control unit outputs a signal indicating that the determination is not possible.

4. The power source device described in claim 1, wherein
the control unit has a determination data memory part that stores determination data wherein the divided voltage value of the voltage dividing resistance is associated with information relating to the type of the light source, and the determination data memory part stores a plurality of items of determination data, each of which corresponds to each of the voltage dividing resistances respectively in a state of being combined with each of the voltage dividing resistances.

5. A light radiation system, comprising:

a light radiation device provided with a light source having one or a plurality of LEDs and an identification resistance whose resistance value is different for each type of the light source, and the power source device described in claim 1, connected to the light radiation device.

* * * * *